TRANSISTOR OSCILLATOR CIRCUIT EMPLOYING VARIABLE DEPLETION CAPACITANCE AND CARRIER STORAGE CAPACITANCE

Filed March 2, 1966

INVENTOR.
NICKOLAS KOVALEVSKI
BY Harvey J. Lowhurst
ATTORNEY

United States Patent Office 3,464,029
Patented Aug. 26, 1969

3,464,029
TRANSISTOR OSCILLATOR CIRCUIT EMPLOYING VARIABLE DEPLETION CAPACITANCE AND CARRIER STORAGE CAPACITANCE

Nicholas Kovalevski, Menlo Park, Calif., assignor to Alfred Electronics, Palo Alto, Calif., a corporation of California Filed Mar. 2, 1966, Ser. No. 531,088
Int. Cl. H03b *5/12*
U.S. Cl. 331—117 1 Claim This invention relates in general to transistor oscillator circuits, and relates more particularly to variable frequency oscillator circuits.

There have been a wide variety of transistor circuits proposed in the art for providing a variable frequency output in response to some type of input signal. Some of these circuits have applied a control voltage to one of the transistor electrodes to vary the frequency of the circuit output. This has produced a variation in the output frequency of the circuit which is rather limited in the tuning range (substantially less than one octave) and is often accompanied by an undesirable variation in the amplitude of the output signal as a function of frequency, thus making such circuits unsuitable for use where the desired tuning range is in the order of magnitude of an octave and where the amplitude of the output should remain substantially constant over the active frequency range of the circuit.

In accordance with the present invention, there is provided a variable frequency transistor oscillator circuit whose output frequency is controlled over a substantially wider tuning range by a control current applied to the base of the transistor. This control current produces a variation in output frequency of the circuit which is substantially linear over a wide frequency range as a function of the amplitude of the control current. While the exact theory of operation of the circuit of this invention is not completely understood and difficult to mathematically analyze because of the non-linear effects present in the operation, it is believed that this variable control current produces variations in the two parameters of a transistor which can be practically varied over an extended range, i.e., the depletion layer capacity appearing across the collector-base terminals, and the carrier storage capacity between the emitter and the base. Further, the variations in these two parameters by the control current can be made to occur in such a fashion that variation of one parameter is the predominant factor in controlling the frequency of oscillation in one portion of the frequency range, while variation of the other parameter is the predominant factor in controlling the oscillation frequency in another portion of the range. By proper selection of the transistor characteristics and the control current, the resulting control may be made to result in a smooth variation of output frequency as a function of the amplitude of the control current. Additionally, by operating in two separate modes, which are ordinarily used in different and separate circuits, a total continuous range of output frequency is obtained which is greater than the range obtainable by control of transistor parameters in either mode alone.

An additional feature of this invention is the effect of variations in these two parameters to counteract each other as far as DC power dissipation in the transistor is concerned. That is, at one of the frequency range, the DC power dissipation resulting from one parameter is low while the other is relatively higher, and at the other end of the frequency range, the situation is reversed as far as DC power dissipation is concerned. This counteracting effect results in relatively low DC power dissipation in the transistor, this dissipation being maximum in the middle of the frequency range. The DC power dissipation is related to the useful RF output power by the efficiency factor $\beta$ and is rather constant over the tuning range.

It is therefore an object of this invention to provide an improved transistor oscillator circuit.

It is a further object of this invention to provide a transistor oscillator circuit in which two of the transistor operating parameters are varied by a single control current to produce a variable frequency output.

It is an additional object of this invention to provide a transistor oscillator circuit in which two of the transistor operating parameters are varied by a single control current to produce a variable frequency output, the circuit operating in one mode in which one parameter is the controlling factor, during one portion of the frequency range and operating in another mode in which the other parameter is the controlling factor during another portion of the frequency range.

It is a further object of this invention to provide a transistor oscillator circuit in which two of the transistor operating parameters are varied by a single control current to produce a variable frequency output, the effects of the control signal on the two parameters tending to counteract each other in terms of the DC power dissipation in the circuit to thereby reduce such power dissipation and the amplitude variations of the output power of the frequency range.

It is an additional object of this invention to provide a transistor oscillator circuit in which two of the transistor operating parameters are varied by a single control current to produce a variable frequency output, the circuit operating in one mode in which one parameter is the controlling factor during one portion of the frequency range and operating in another mode in which the other parameter is the controlling factor during another portion of the frequency range, the variations in the two parameters producing an output frequency which varies linearly over a wide range.

Objects and advantages other than those set forth above will be apparent from the following detailed description when read in connection with the accompanying drawing, in which.

Figure 1:
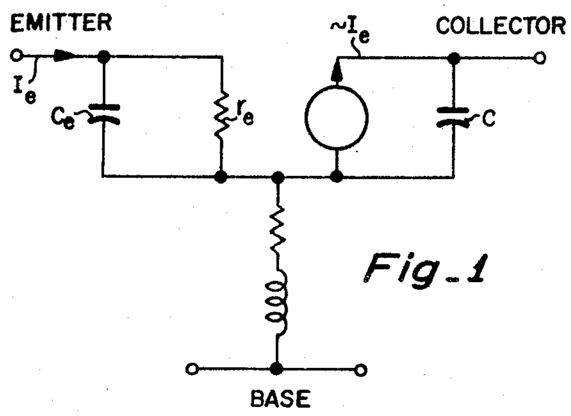
FIGURE 1 is a schematic diagram of a simplified equivalent circuit of a transistor, illustrating the two parameters of the transistor which are varied in accordance with this invention.

Referring to FIGURE 1, there is shown a simplified equivalent circuit of a transistor which illustrates some of the theory of operation of this invention. The depletion layer capacity of the transistor, which appears across the collector-base terminals, is represented by C. The value of C depends mainly on the applied reverse bias to the collector-base junction, and it decreases with increased applied collector-base voltage.

The other parameter is the carrier storage capacity which is represented, in FIGURE 1, by $C_e$ and is shown in parallel with the resistance $r_e$. The value of $C_e$ and $r_e$ depends primarily on the emitter current, $I_e$. The dependence of $r_e$ is given to good accuracy for silicon transistors by the expression $$r_e\ (\text{ohms})=\frac{35}{I_e}\ (\text{ma.})$$

$C_e$ is directly proportional to $I_e$, so that the product $$C_e\frac{r_e}{\omega f}$$

is nearly independent of $I_e$, where $\omega f=2\pi f_d$, with $f_d$ being the frequency at which the forward current gain $f_e$ of the transistor is 3 db down from its DC value.

Figure 2:
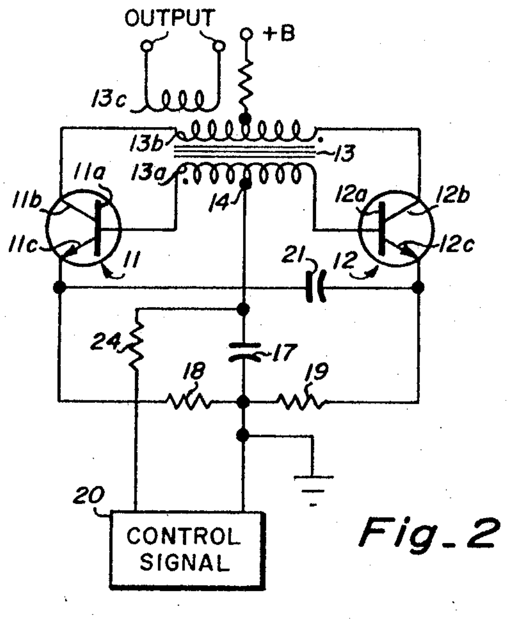
FIGURE 2 is a schematic diagram of a transistor oscillator circuit in accordance with this invention.

Referring now to FIGURE 2, there is shown one embodiment of the invention which provides a variable frequency output over a wide range. In connection with FIGURE 2, it will be noted that two transistors are shown, connected in push-pull relationship, in order to suppress even harmonics in the circuit. However, it will be understood that the invention is equally operable with a single transistor controlled in the manner to be described below.

The circuit comprises a pair of transistors 11, 12, of a suitable type, each having bases 11*a*, 12*a*, collectors 11*b*, 12*b* and emitters 11*c*, 12*c*. Bases 11*a*, 12*a*, are connected to opposite ends of the secondary winding 13*a* of a feedback transformer 13 having a primary winding 13*b*. The end terminals of winding 13*b* are connected to collectors 11*b*, 12*b*. A suitable source of DC power, represented by the terminal labelled +B, is connected to the circuit through the center tap of winding 13*b*. The output from the circuit appears across a winding 13*c* associated with transformer 13. The center tap 14 of secondary winding 13*a* is connected to ground through a capacitor 17. Emitters 11*c*, 12*c* are connected to ground through associated resistors 18, 19. The two emitter resistors are employed in order to insure equal sharing of the emitter bias current from the DC source, even if the DC parameters of the individual transistors vary somewhat. Emitters 11*c*, 12*c* are maintained at the same RF potential through the use of a capacitor 21.

The control current in accordance with this invention may be applied to the transistor bases in any suitable manner, and it is convenient to achieve this by applying a control voltage from a control signal source 20 through a resistor 24 to the center tap of winding 13*a* and hence to bases 11*a*, 12*a*.

In considering the theory of operation of the circuit shown in FIGURE 2, the following preliminary remarks are pertinent. In general, as the control current applied from source 20 to the transistor bases is increased or decreased, the emitter currents are also increased or decreased, causing the voltage drops across the emitter resistors 18, 19 to increase or decrease. The effect of these voltage drops across the emitter resistors is to decrease or increase the net or reverse voltage bias applied to the collector-base junctions, with a corresponding increase or decrease in the value of the depletion capacities C of the transistors. Thus, the increase or decrease of the control current simultaneously produces an increase or decrease in the values of both the depletion capacities C and the carrier storage capacities $C_e$. The variations in these capacities, in turn, produce a decrease or increase of the frequency of oscillation appearing across output winding 13*c*.

It will be understood that two different modes of operation are possible and that both are utilized at different ranges of control to achieve as wide a range of frequency sweep from the output of the circuit as possible. One mode of oscillation is the nearly sinusoidal oscillation which occurs near the resonant frequency of the circuit formed by the base-collector capacity which is in parallel with the effectively serially connected, inductively coupled halves of winding 13*a*, 13*b*. In this condition of operation, which occurs at the higher part of the frequency range, limiting occurs automatically, in properly designed circuits, because the values of the transistor parameters averaged over one cycle of oscillation adjust themselves to provide unity gain and zero phase shift around the feedback loop. In this mode of operation, the frequency of oscillation is determined primarily by the value of the base-collector capacity, which, it will be recalled, varies with the reverse bias and hence with the applied control signal. The circuit in this mode of operation may be considered as a modified Hartley oscillator, with the depletion capacity as a part of a parallel resonant circuit.

As the control signal from source 20 is increased in amplitude a sufficient amount, and the output frequency of the circuit is descreased to a certain extent as a result of the increased depletion capacity, the effective Q of the circuit is lowered and another mode of operation takes place. At this time, the amplitude of oscillations becomes current limited and the oscillations become a relaxation type. This relaxation process can be described as follows. At the start, a current begins to flow from the source into the collector, assuming a pnp transistor is employed. This current is reinforced by the current into the base of the transistor due to the positive feedback provided by transformer 13. This current increases with a time constant which is determined by the depletion capacity and the emitter-base impedance. An increase in the amplitude of the control signal from source 20 affects these parameters in a manner to increase this time constant. The growth of the collector current continues until it is equal to the maximum current available from the DC source. The DC source can be considered as nearly a constant current source due to the presence of resistors 18, 19 in the emitter circuits.

At this point, the rate of current change reverses its sign, thus reversing the polarity of the voltage at the terminals of transformer winding 13*a* connected to the base-emitter junction. The voltage across this winding now acts to reduce the collector current still more, and this action is reinforced by the positive feedback action of transformer 13.

At a certain point, the condition considered at the start of this mode of operation is reached and the process is repeated. It will be seen that in this mode of operation, the increase in emitter current is effective in two ways to lower the frequency. First, the emitter current varies the time constant of the circuit and, secondly, with this time constant, the value of the current which must be reached before the reversal of the process occurs is higher, thus requiring more time at a given time constant to reach this value of current.

In connection with the DC power dissipation in the circuit, it will be seen that the effects of variations in the control signal on the two parameters tend to counteract each other. That is, at relatively high values of applied control current, the DC bias across the collector-base is at its low value, while the emitter current is high. Conversely, at relatively low values of control current, the situation is reversed. Thus, the DC power dissipation in the transistor is quite low and reaches a maximum value somewhere in the middle of the control current range.

Figure 3:
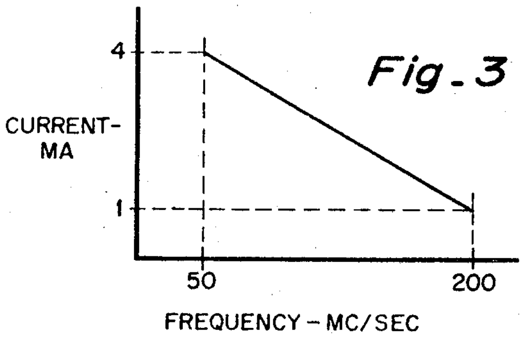
FIGURE 3 is a graph illustrating the linear variation of output frequency as a function of control signal amplitude which may be obtained with the circuit of FIGURE 2.

Thus, the circuit of the present invention is operable to provide a controlled output frequency which may be varied over a wide range in response to variations in the control signal from source 20 applied as described. It has been found that this variation in output frequency is extremely linear relative to the control signal amplitude, as shown in the graph of FIGURE 3. As shown there, the control current may be varied from 1 to 4 milliamps to produce a very linear variation in output frequency from 200 megacycles to 50 megacycles.

Although the illustrated embodiment showed the DC potential of the collectors maintained at a fixed value while the emitters were grounded through the emitter resistors, it will be understood that the invention is equally operable if the collectors are maintained at ground potential while the DC control signal is applied to the emitters through appropriate resistors.

Without limiting the invention in any way, the following table lists the values of the elements of a circuit similar to that shown in FIGURE 2 which have been found to produce very satisfactory operation as a sweep generator.

Transistors 11, 12—2N3563
Resistors 18, 19—1000 ohms at ¼ watt
Capacitor 17—1000 picofarads, ceramic
Capacitor 21—500 picofarads, ceramic Transformer 13—Manufactured by Ferroxcube Part No. K5–050–06–123

Winding:

13*a*—1 turn
13*b*—2 turns
13*c*—1 turn

While the above detailed description has shown, described and pointed out the fundamental novel features of the invention as applied to various embodiments, it will be understood that various omissions and substitutions and changes in the form and details of the device illustrated may be made by those skilled in the art, without departing from the spirit of the invention. It is the intention, therefore, to be limited only as indicated by the scope of the following claim.

What is claimed is:

1. An oscillator circuit, comprising:

a pair of semi-conductor devices each having an emitter electrode, a collector electrode and a base electrode, the inherent capacity between the base electrode and the collector electrode defining its depletion capacitance and between the base electrode and the emitter electrode defining its carrier storage capacitance;

a feedback transformer having a first winding and a second winding, said first winding being provided with a center tap and having its end terminals connected to said base electrodes, said second winding having its end terminals connected to said collector electrodes, coupled portions of said first and said second windings forming an inductive series feedback path in parallel with said depletion capacitance of each of said devices;

a radio frequency equalizing capacitor connected across said emitter electrodes;

a pair of emitter resistors connected serially between said emitter electrodes, said resistors having a common junction point;

an isolating capacitor connected between said center tap of said first winding and said common junction point;

a source of control current connected across said isolating capacitor; and means for varying said control current supplied by said source to vary the emitter currents of said semi-conductor devices, the variations in said emitter current of each of said devices varying the value of said depletion capacitance and said carrier storage capacitance of each of said devices to thereby vary the frequency of the signal across said windings.

References Cited

UNITED STATES PATENTS 3,292,106 12/1966 Baldwin ------------ 331—168

JOHN KOMINSKI, Primary Examiner

U.S. Cl. X.R.

331—59, 111, 114; 332—16